United States Patent
Krampotich et al.

Patent Number: 6,082,540
Date of Patent: Jul. 4, 2000

[54] CUSHION SYSTEM FOR WAFER CARRIERS

[75] Inventors: Dennis J. Krampotich, Shakopee, Minn.; D. Kerry Kiser, Sherwood, Oreg.

[73] Assignee: Fluoroware, Inc., Chaska, Minn.

[21] Appl. No.: 09/226,593

[22] Filed: Jan. 6, 1999

[51] Int. Cl.$^7$ ................................................. B65D 85/90
[52] U.S. Cl. ........................ 206/445; 206/454; 206/711
[58] Field of Search ................................ 206/454, 710, 206/711, 832, 833, 445

[56] References Cited

U.S. PATENT DOCUMENTS

| | | | |
|---|---|---|---|
| H1762 | 12/1998 | Kaempf et al. | 206/710 |
| 4,520,925 | 6/1985 | Johnson . | |
| 4,718,549 | 1/1988 | Rissotti et al. . | |
| 4,721,207 | 1/1988 | Kikuchi | 206/711 |
| 4,880,116 | 11/1989 | Kos | 206/454 |
| 4,886,169 | 12/1989 | Ayers et al. | 206/710 |
| 5,207,324 | 5/1993 | Kos | 206/711 |
| 5,253,755 | 10/1993 | Maenke . | |
| 5,452,795 | 9/1995 | Gallagher et al. | 206/711 |
| 5,555,981 | 9/1996 | Gregerson | 206/711 |
| 5,711,427 | 1/1998 | Nyseth . | |

Primary Examiner—Jim Foster
Attorney, Agent, or Firm—Douglas J. Christensen

[57] ABSTRACT

In a preferred embodiment of the invention, a transport module suitable for 300 mm wafers has a cushioning system that attaches to the interior of an enclosure door. The system comprises a pair of upright parallel cushions, each comprising an elongate base portion with a plurality of integral fingers extending at an acute angle from the base members. Each sequential finger of each cushion engaging every other wafer. Each finger having an arm portion and a wafer engaging portion. The wafer engaging portion comprising a curved convex surface to provide minimal vertical line contact with the circumferential outer surface of the wafer without providing axial constrainment of the wafer. The base portions are attached to the inside facing door panels by a plurality of attachment portions each comprising a split shank portion that extends through the aperture and a plurality of flange portions on the ends of the split shank portions for securing the base portions to the inside panel. An O-ring may be positioned on the shank portion for sealing the connection. Additional extension members may extend intermediate the arm portions to provide a contact point laterally displaced from the base member such that when the wafer engagement portions are loaded by engagement with the wafers, the connection of the attachment portion to the interior door panel operates as a fulcrum to precisely control the positioning, holding force, and deflection of the fingers.

25 Claims, 3 Drawing Sheets

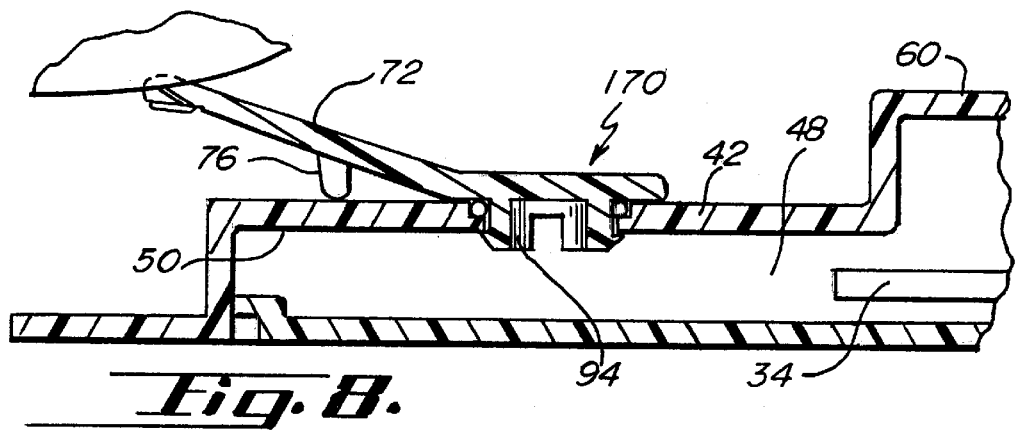
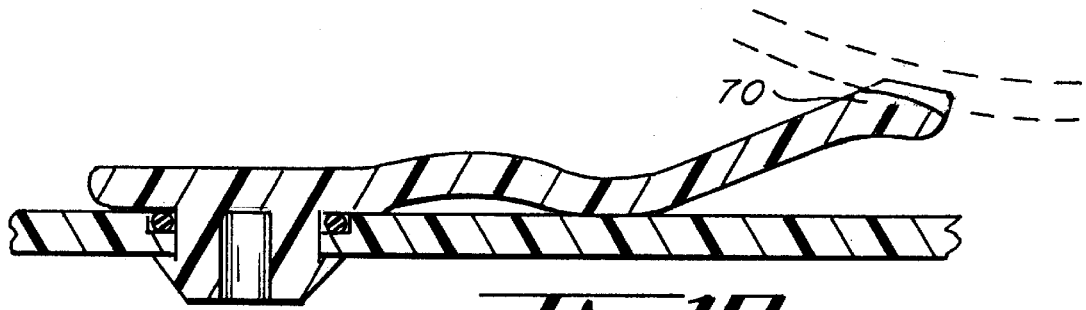
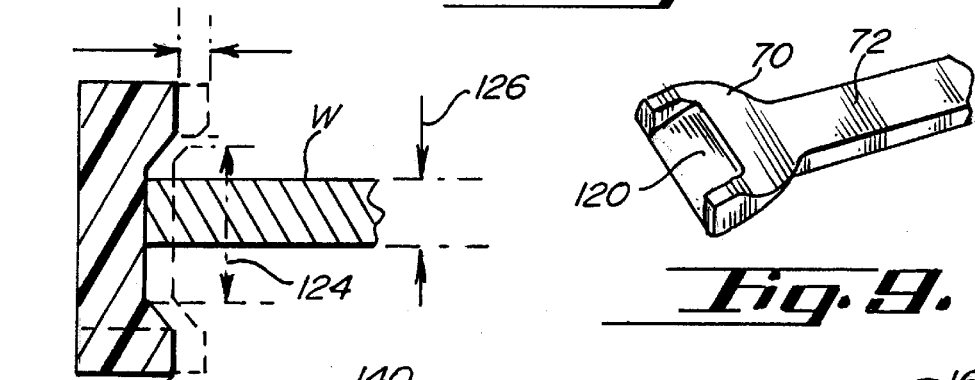
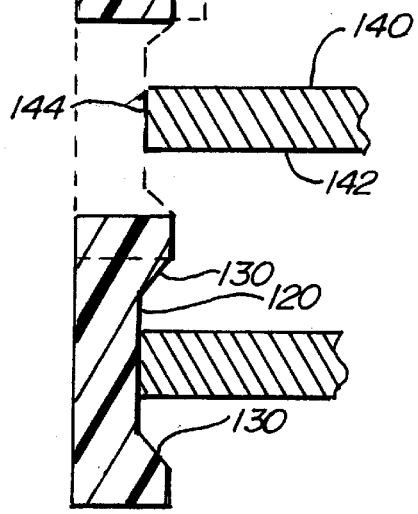
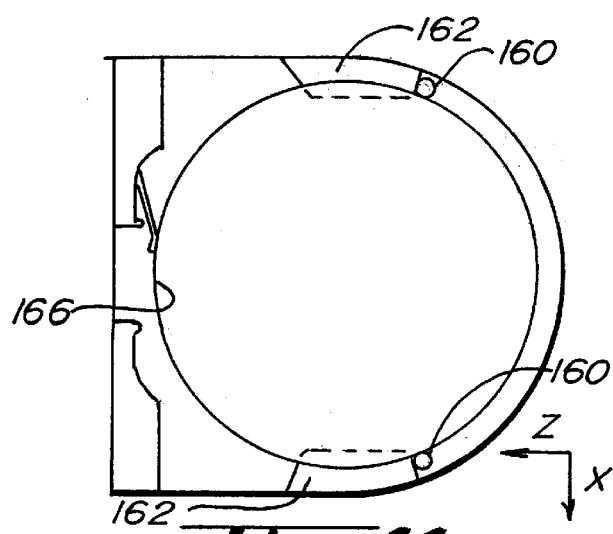

CUSHION SYSTEM FOR WAFER CARRIERS

BACKGROUND OF THE INVENTION

This invention relates to carriers for wafers that are processed into semiconductor units, more particularly, the invention relates to sealable enclosures for holding wafers in a horizontal orientation.

Semiconductor wafers are subjected to numerous steps during processing in various pieces of processing equipment. The wafers must be transported from workstation to workstation and often must be temporarily stored in order to accommodate the necessary processing steps. Usually such transport and storage is accomplished by putting the wafers into sealed containers to minimize exposure of the wafers to environmental contaminants.

As semiconductors have become larger in scale, that is, as the number of circuits per unit area has increased, contaminants in the form particulates have become more of an issue. The size of particulates that can destroy a circuit has decreased and is approaching the molecular level. Particulate control is necessary during all phases of manufacturing, processing, transporting, and storage of semiconductor wafers. The industry is moving toward processing larger and larger wafers into semiconductors. Three hundred millimeter (300 mm) wafers are now commonplace.

Numerous configurations of carriers have been previously known for handling, storing, and shipping wafers. A common component in carriers configured as closable containers is a molded plastic member known as a cushion to stabilize the positioning of wafers in the container. Such shipping containers with cushions have been previously known as disclosed, for example, in U.S. Pat. Nos. 4,043,451; 4,248,346; 4,555,024; 5,253,755; 5,273,159 and 5,586,658. These types of containers typically include vertical wafer-receiving channels and cushions at the upper and/or lower ends. Various configurations of cushions have been utilized for securing the vertically oriented wafers in the channels. For example, the cushions may comprise fingers that extend from or attach to the cover for gripping the wafer edges. These cushions conventionally have a wafer engaging portion with a V-shaped cross section. An integral finger portion connects to the wafer engaging portion and also connects to a base attached to the cover.

Such conventional cushions are manufactured from relatively pliable plastic such as polyethelene, or even more pliable plastics, to minimize the pressure exerted on each wafer edge. Such materials are subject to creep and the loss of resiliency and cushioning performance. These cushions may be integral with the container closure (see for example U.S. Pat. No. 5,586,658 assigned to owner of the instant invention) or may be attached to the closure by various means such as a snap-in arrangement (see U.S. Pat. No. 4,880,116 to Kos). Highly stable and precise attachment of cushions to door have been elusive. Metallic fasteners, due to their potential of creating metal particulars are to be avoided.

These shipping devices have typically been designed to transport wafers or disks in a vertical orientation from place to place, whereas most processing workstations require that wafer processing carriers retain wafers horizontally. Thus wafers must be reoriented for many processing steps. Where the entire container is reoriented with wafers in place, the wafers can shift and scrape against the wafer pockets producing particulates.

Corresponding with the increase in the size of wafers being processed into semiconductor chips, the industry is also shifting from vertically oriented containers to containers that maintain the wafers horizontally. Forward wafer restraints for such carriers have comprised a cushion member attached to the door and extending vertically and transverse to the planes of the wafers to engage each wafer along a vertical line. The cushions may be fixed to the inside surface of the door such that they engage the stack of wafers as the door is inserted into the door frame or alternatively, the cushions may be attached to mechanisms in the door to extend and retract the cushions independently of the movement of the door into and out of the door frame. Known cushions for such horizontal containers consist of a vertically positioned resilient rod or bar or a vertically oriented elongate base member with a plurality of fingers extending therefrom to engage the edge of each sequential wafer. See U.S. Pat. No. 5,711,427 which is incorporated herein by reference.

With the vertically oriented carrier, wafer receiving channels are designed to hold wafers firmly with a minimum of horizontal movement. With the horizontally oriented carrier, wafer receiving slots are larger than the thickness of wafers to enable wafers to be inserted horizontally into containers and lowered onto a seating position on wafer shelves. To avoid particulate generation, there will ideally be no sliding of the wafer on the wafer shelves. In such carriers, now known as transport modules, contact with the wafers by the carrier is desirably kept to a minimum. For example, as disclosed in U.S. Pat. No. 5,788,082, which is incorporated herein by reference, see FIGS. 14, 16, and 17 and the text associated therewith. Minimal contact with the wafers is believed to create minimal opportunity for particulate generation and particulate contamination of the wafers. The shelves and integral beads which provide the minimal contact as disclosed in U.S. Pat. No. 5,788,082, are made of specialized abrasion resistant materials. Conventional cushion finger (and other cushion designs) for engaging wafer edges grip the wafer edge and restrain the wafer in both axial directions and radially. Such conventional fingers contact the circumferential surface of the wafer as well as providing the constraining forces at the edge between planar top and bottom surfaces of the wafer and said circumferential surface. Such gripping is inimical to the minimal contact with the wafer; and in transport modules, the need for axial (up-down) constraint of the wafers by the cushions is not necessary in that the modules are typically utilized for transporting between workstations or for temporary storage of the wafers. Thus severe jostling of the carriers, such as may occur with shipment from facility to facility, is typically not a consideration with transport modules.

The 300 mm wafers are significantly heavier than previous 200 mm and smaller wafers. Although this weight operates to effectively maintain the wafers seated on the wafer shelves, the weight also renders traditional resilient cushioning fingers, such as made from polyethelene, ineffective to maintain the radial position of the wafers on the shelves. Any sliding of the wafer on the shelves has the potential of creating damaging particulates. Thus a more rigid cushion is needed beyond conventional polyethelene. Use of stiffer materials which would have a correspondingly greater spring constant would require greater precision in manufacturing. Deflection of the fingers would need to be less and more carefully controlled to avoid putting excessive force on the edge of the wafers subjecting them to risk of damage. Moreover, the cushioning members would need to be securely anchored to the closure to maintain the controlled deflection and controlled force on the wafers. These requirements are difficult to accomplish in the sizes associated with 300 mm transport modules.

Conventional individual resilient fingers for engaging wafers, whether for horizontal or vertically oriented wafers, have a configuration of a V-shape with a bottom wafer seating portion that is sized to the thickness of the wafer to hold the same securely. Moreover, each wafer is supported at the same circumferential position. That is, the cushions are arranged in a linear row or column. The spacing between horizontal wafers in 300 mm front opening carriers has been standardized by the industry to allow maximum density in the carriers while still allowing insertion room for a robotic arm for insertion and removal. This minimal amount of vertical space makes it extremely difficult to manufacture cushions with vertically aligned wafer engaging fingers and wafer engaging portions that have any allowance for slight vertical misalignments in the wafer engaging portions such as might be caused by variation in manufacture of the cushions or wafers misaligned on the shelves. Thus, a wafer cushion system for providing a forward constraint for sealable wafer enclosures is needed that provides a precise control of wafer engagement, that is stiffer than traditional cushions, that provides for manufacturing variations, wafer-cushion engagement portion misalignments, and that has minimal contact with the wafers.

SUMMARY OF THE INVENTION

In a preferred embodiment of the invention, a transport module suitable for 300 mm wafers has a cushioning system that attaches to the interior of an enclosure door having a pair of upright parallel cushions, each comprising an elongate base portion with a plurality of integral fingers extending at an acute angle from the base members. Each sequential finger of each cushion engaging every other wafer. Each finger having an finger portion and a wafer engaging portion. The wafer engaging portion comprising a curved convex surface to provide minimal vertical line contact with the circumferential outer surface of the wafer without providing axial constrainment of the wafer. The base portions are attached to the inside facing door panels by a plurality of attachment portions each comprising a split shank portion that extends through the aperture and a plurality of flange portions on the ends of the split shank portions for securing the base portions to the inside panel. An O-ring may be positioned on the shank portion for sealing the connection. Additional extension members may extend intermediate the finger portions to provide a contact point laterally displaced from the base member such that when the wafer engagement portions are loaded by engagement with the wafers, the connection of the attachment portion to the interior door panel operates as a fulcrum to precisely control the positioning, holding force, and deflection of the fingers.

It is an object of particular embodiments of the invention to provide forward constraint of wafers in a front opening wafer enclosure with minimal wafer contact by the cushion.

It is an object of particular embodiments of the present invention to provide a wafer carrier with cushions steadfastly secured to the inside panel of the wafer container door to provide precise control of the engagement of the wafers.

Another object and advantage of particular embodiments of the invention is to provide minimal contact with the wafer to reduce contamination of wafers during transport and storage.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

Another object and advantage of particular embodiments is that the wafer engagement portions allow for misalignment between the wafers and said wafer engagement portions.

BRIEF DESCRIPTION OF THE DRAWINGS

FIG. 8 is a cross-sectional view of a wafer engagement finger on a door engaging a wafer.

FIG. 9 is a perspective view of wafer engaging portion of a wafer engaging finger.

FIG. 10 is a cross-sectional view of wafers engaged by wafer engaging portions of a cushion according to the present invention.

FIG. 11 is a diagrammatic view showing the three point contact of a wafer in a wafer enclosure according to the present invention.

FIG. 12 is a perspective view of an alternate embodiment of the invention.

It is understood that the above figures are for illustrative purposes only and are not meant to limit the scope of the claimed invention.

DETAILED DESCRIPTION OF THE PREFERRED EMBODIMENT

Figure 1:
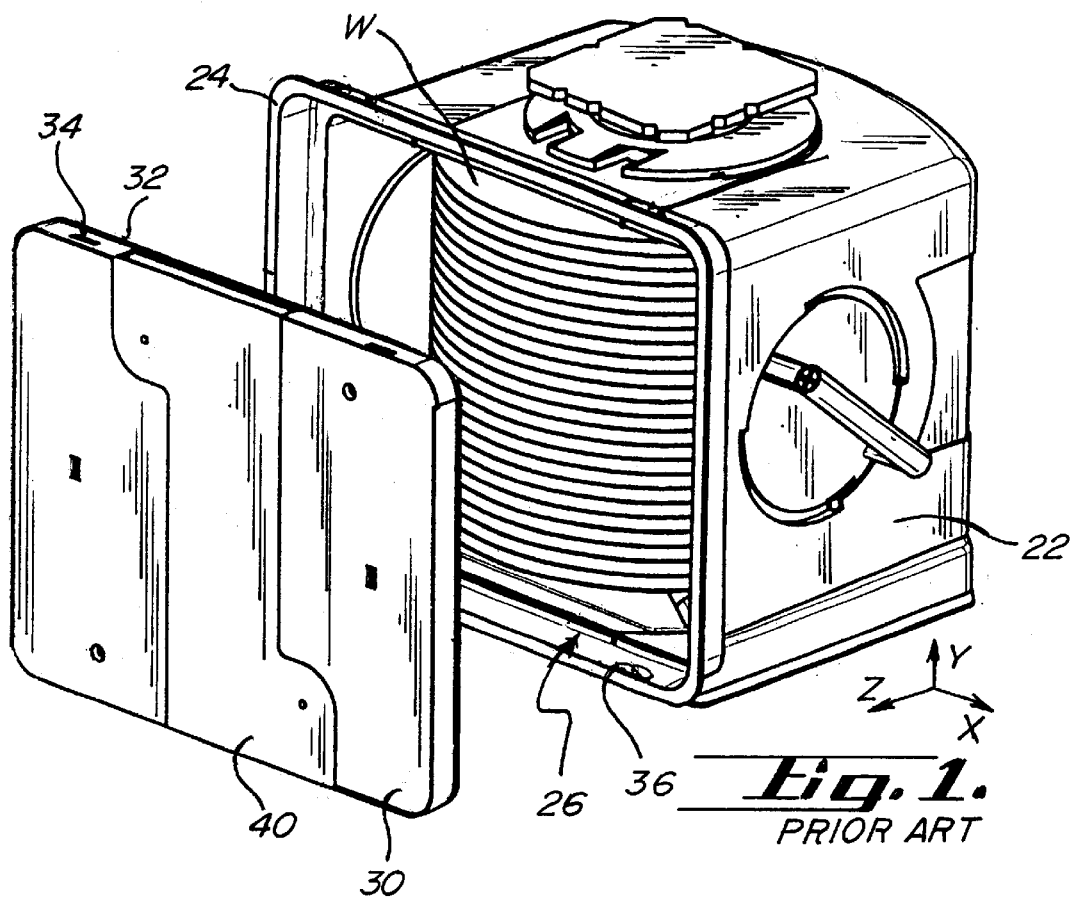
FIG. 1 shows a perspective view of a prior art wafer carrier for holding wafers in a horizontal orientation suitable for incorporating the present invention.

Referring to FIG. 1, a prior art front opening transport module which is appropriate for use with or as part of the instant invention. The transport module 20 is in generic terms a wafer enclosure and is generally comprised of an enclosure portion 22 with a door frame 24 defining a front opening 26 for insertion and removal of wafers. A door 30 is configured to sealingly enclose the front opening and includes a seal 32 and a latch mechanism 34 to engage with latch receivers 36 on the enclosure portion 22. Further details of the door are shown in FIGS. 2, 3, 4, and 8. The door generally comprises an inside or interior facing surface 38 and exterior facing side 40, and interior wall 42 and an exterior wall 44. The interior and exterior walls define an interior space 48 within which is contained the latching mechanism 34. Interior wall 42 has an exteriorly facing surfacing surface 50.

Figures 2, 4:
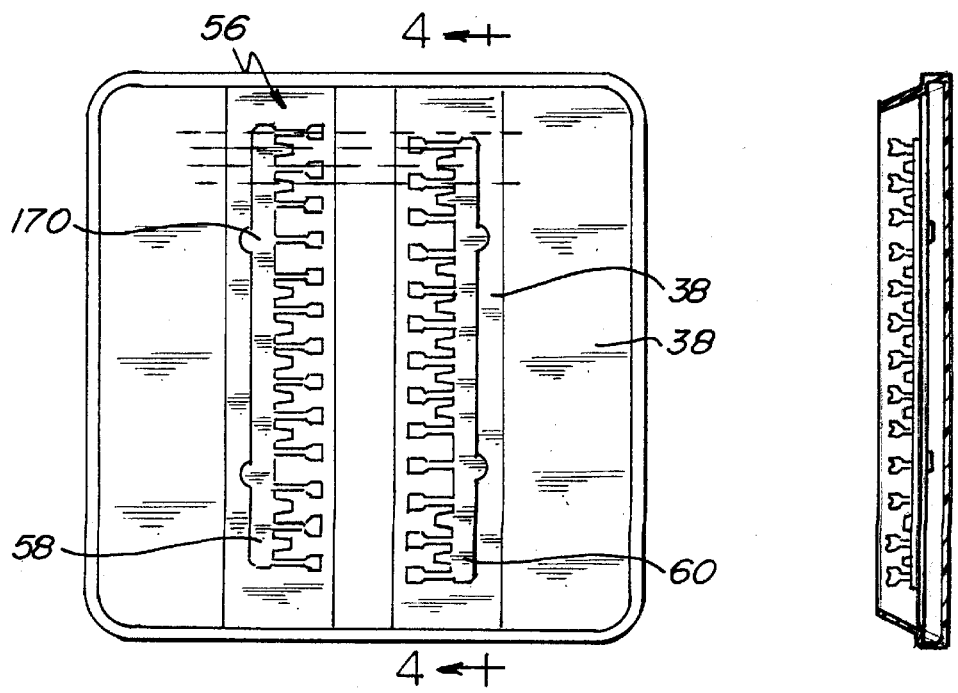
FIG. 2 is an elevational view of the interiorly facing side of the door of a carrier embodying the present invention.
FIG. 4 is a cross-sectional view of the door of FIG. 2 taken at line 2—2.
Figure 3:
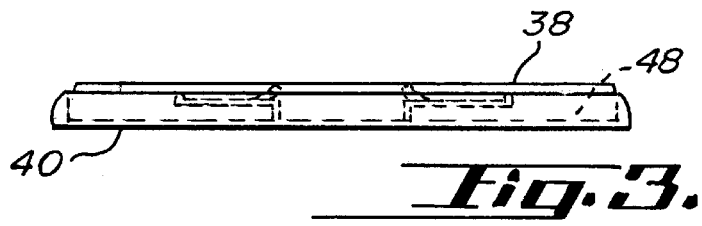
FIG. 3 is a top plan view of the door as shown in FIG. 2.
Figure 5:
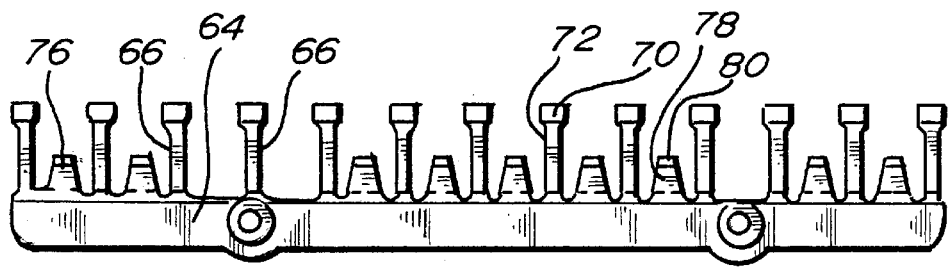
FIG. 5 is an elevational view of a cushion according to the present invention.
Figure 6:
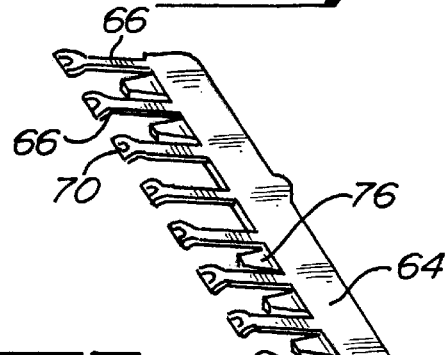
FIG. 6 is a perspective view of the cushion of FIG. 5.

Referring to FIG. 2, a cushioning system 56 comprising two cushions 58, 60 are mounted on the interior facing surface 38 of the door 30. As illustrated in FIG. 3 and FIG. 8, the cushions are set inwardly from the most outerly surface 60 of the interiorly facing side 38 of the door.

Details of the construction of a preferred embodiment of the cushions and the attachment of the cushions to the door are disclosed in FIGS. 5, 6, 7, 8, and 9. Each cushion generally comprises a base portion 64 and extending therefrom and integral therewith are a plurality of wafer engagement fingers 66. Each wafer engagement finger comprises a wafer engagement portion 70 and an intermediate finger portion 72.

The cushions are each vertically oriented with the wafer engaging fingers extending in a lateral direction from the base portion at an acute angle relative to the inside surface 38. Also extending laterally in the same lateral direction are a plurality of extension members 76 which each include an intermediate section 78 and a contact portion 80 which is in contact engagement with the inwardly facing surface 38 of the wall 42.

Extending from the base portion 64 of each cushion is a pair of attachment portions 86 each of which comprises a shank portion 88 and a flange 90. The shank portion is configured as a split shank to define a plurality of prongs 92 and a plurality of flange portions 93 on the ends of the split shank portions 94.

Figure 7:
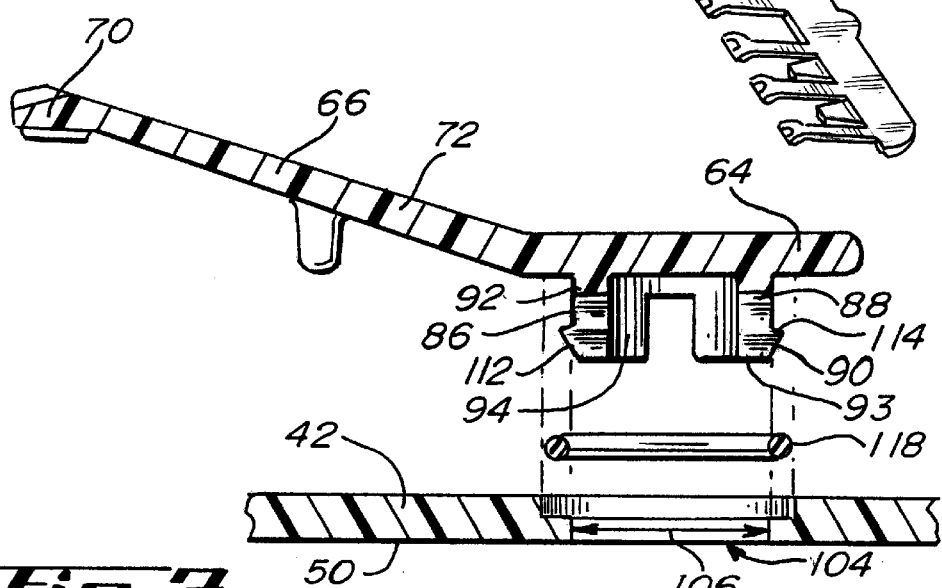
FIG. 7 is a cross-sectional exploded view of the cushion of FIGS. 5 and 6 and the interior door.

Details of the attachment of the cushions 58 to the inwardly facing wall 42 are shown in FIGS. 7 and 8. The wall has an attachment opening 104 with a diameter 106. The attachment portion 86 is sized for an interference fit with the attachment opening 104. The attachment portion may be urged into the attachment opening by the deflection of the shank portions 88 and the flange portions 80 caused by the engagement of camming surfaces 112 with the wall 42. The flange portion may also have a cammed interior surface 114 which provides an additional downward force of the base portion as shown in FIG. 8 after the attachment portion is snapped into place. An elastomeric O-ring 118 may be positioned intermediate the base portion and the wall to provide a sealed connection.

Referring to FIGS. 2, 9, and 10, details of the engagement of the cushions with the wafers are disclosed. Each of the wafer engagement portions 70 of the wafer engaging fingers 72 have a convex wafer engagement surface 120 which has a width 124 which is substantially greater than the width 126 of the wafers in the carrier. Each wafer engagement portion further has inclined surfaces 130 providing a lead into the convex wafer engagement surface 120. Each wafer has an upper surface 140, a lower surface 142, and a circumferential surface 144. The inclined lead-in surfaces 130 additionally operate as limits or constraints to the wafer to the extent that such surfaces engage the corner between the upper or lower surface and the circumferential surface. In conventional wafer cushion fingers, the lead-in surfaces will engage both corners of the wafer to grip and secure the wafer in position. In the instant invention, the lead-in surfaces are not generally intended to contact said circumferential surface. Although the lead-in surfaces do act as constraints to prevent the wafers from becoming unseated in their slots during vibration or jostling. Moreover, in preferred embodiments of the instant invention the contact between the wafer engagement portion and the wafers is limited to a substantially vertical line contact caused by the contact between the two convex surfaces, the wafer circumferential surface and the convex wafer engagement surface.

Note that in particular embodiments the wafer engagement portions of each particular cushion only engage every other wafer. This allows the extended width 124 of the wafer contact surface 120 which would not be possible with conventional aligned wafer engagement portions.

Referring to FIG. 11, is a simplified cross-sectional view of the carrier of FIG. 1 embodying the invention as shown and illustrating the support for each wafer carrier. The restraint of the wafer carrier in the Z-X plane is provided by posts 160 on each of the opposing wafer shelves 162. A forward restraint is provided by one wafer engagement portion by one of the two cushions on the door, thus providing a three-point restraint in the horizontal plane. Note that each of the forward restraints is positioned either slightly left or slightly right of the front vertical center line 166 of the stack of wafers.

Another aspect of the invention is provided by the extension members 76. For manufacturing and assembly ease, each cushion is attached to the inside-facing wall of the door at only two connection points 170. Said connection points are positioned in a vertical line at the base portion 64. To provide precise positioning and control of the engagement of the wafers by the wafer engagement portions of the cushions and additional support displaced from the vertical line of the connection points is provided by said extension member. The wafer engaging fingers 72 is cantilevered outwardly from the base member. The extension member also is cantilevered out from the base member but is loaded in the opposite direction. The extension member may be preloaded or stressed before wafer engagement such as by molding the cushion with the contact portion having an interference fit with the interiorly facing wall 42. Alternatively, the cushion can be molded with the contact portion positioned approximately at the interiorly facing surface.

The extended width 124 of the contact surface of the wafer engagement portion allows for variations in the positioning of said engagement portions that might occur during molding or due to other factors such as wear. Additionally, the extended width allows for slight misalignment of the door.

In configurations where both the extension member and wafer engagement portion are laterally displaced from the connections 170, precise deflection of the wafer engaging fingers is provided. The connection point 170 operates as a fulcrum relative to the extension member and the wafer engagement arm.

In the ideal situation, the cushion may be molded principally of polyetheretherketone (PEEK). Polytetrafluorethylene (PTFE) may be added in small quantities; for example, 5%. PEEK provides a fairly stiff and resilient cushion. An ideal deflection of the wafer engagement portion has been found to be 0.040 inches.

Referring to FIG. 12, an alternate embodiment of a cushion is shown in which the contact portion, which is displaced laterally from the connection points is part of and integral with each wafer engagement finger. This configuration again provides a stable foundation and precise control of the engagement of the wafer engagement portion and the wafer. Note that in both the embodiments of FIGS. 8 and 12, the contact portion may initially be slightly separated from the interiorly facing surface of the wall 42 before engagement with the wafer. The wafer engagement will then contact the wafer engagement portion and rotate the cushion assembly about the axis formed by the vertically aligned connection points to the point where the contact portion engages the wall surface. At this point, deflection of the wafer engagement fingers will begin.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

We claim:

1. A wafer enclosure for holding a plurality of wafers in a horizontal stacked configuration, the enclosure having a wall with an inwardly facing surface, an outwardly facing surface, an attachment opening in said wall, said attachment opening having a diameter, a front opening for passing wafers to and from said enclosure, a door to close said front opening, and an elongate wafer engagement component for contacting the edge portions of wafers stacked in the enclosure, the wafer engagement component comprising a base portion that extends along the inwardly facing surface, an attachment portion integral with said base portion for insertion into said attachment opening, the attachment portion having a shank portion extending through the attachment opening and a flange portion at the end of said shank portion opposite the base portion for engagement with the outwardly facing surface and for retaining the attachment portion in the attachment opening thereby securing the wafer engagement component to the wall, the flange portion configured to allow insertion of the attachment portion into the attachment opening by deflecting laterally the flange portion, the wafer engagement component engaging the wall in at least three non-linearly positioned points for providing a stable foundation for the wafer engagement component on the wall.

2. The wafer enclosure of claim 1, wherein the attachment opening has a periphery, the flange portion of each attachment portion having a cammed exterior surface for engaging the periphery and flexing the flange portion and shank as the attachment portion is urged into the attachment opening facilitating the attachment of the component to the wall.

3. The wafer enclosure of claim 1, further comprising an elastomeric O-ring positioned intermediate the base portion and the inwardly facing surface.

4. The wafer enclosure of claim 3, wherein the wall has an attachment opening corner portion, and wherein the flange portion further comprises a cammed interior surface opposite the cammed exterior surface, said cammed interior surface engaged with the attachment opening corner portion thereby urging the base portion toward the wall and compressing the O-ring between the wall and the base portion.

5. The wafer enclosure of claim 1, wherein the attachment opening comprises a plurality of circumferentially spaced fingers extending substantially normally from the base, each finger having a flange section whereby the flange sections of the plurality of fingers form the flange portion of the attachment portion, the flange portion having an outer diameter greater than the diameter of the attachment opening, each flange section having a cammed surface for deflecting each respective finger radially inward upon insertion into the attachment opening to decrease the diameter of the flange portion to substantially the diameter of the opening.

6. The wafer enclosure of claim 5, further comprising an elastomeric O-ring positioned intermediate the base and the inwardly facing surface.

7. The wafer enclosure of claim 6, wherein the wall has an attachment opening corner portion, and wherein each flange section comprises a cammed interior surface, said cammed interior surface engaged with the attachment opening corner portion thereby urging the base portion toward the wall and compressing the O-ring between the wall and the base portion.

8. The wafer enclosure of claim 6, wherein the wafer engaging component is a wafer cushion and comprises a plurality of fingers extending from the base portion away from the wail for engaging wafers held in the enclosure.

9. The wafer enclosure of claim 6, wherein the door comprises an interior wall and an exterior wall and wherein the attachment opening is on the interior wall.

10. The wafer enclosure of claim 1, wherein the wafer engagement component has an extension member integral with the base portion and extending therefrom, the extension member having an intermediate section spaced from the wall and a contact portion in contact engagement with the inwardly facing surface of the wall whereby the contact portion is one of the at least three non-linearly aligned contact portions.

11. The wafer enclosure of claim 1, wherein the base portion has a lower surface in confronting relationship with the wall, an opposite top surface, and a pair of sides intermediate the lower surface and the top surface, and wherein the wafer engagement component comprises a plurality of wafer engaging fingers extending laterally away from the base portion at one of the sides, the fingers spaced from the wall and having a wafer engaging portion separated from the wall.

12. The wafer enclosure of claim 10, wherein the extension member is in a stressed state with a bias against the wall at the contact portion thereby providing a secure and stable attachment of the wafer engagement component to the wall.

13. A wafer enclosure comprising an enclosure portion and a door, the enclosure portion with a front having a door frame defining a front opening for insertion and removal of wafers, the enclosure portion having a plurality of horizontally oriented slots vertically stacked for receiving a plurality of axially aligned horizontally oriented wafers, the door configured for closing the open front and latching to the door frame, the door having an interiorly facing side and a first upright cushion base portion and a second upright cushion base portion attached to the door at said interiorly facing side, each of the upright cushion base portions having a plurality of parallel wafer engaging fingers extending from said cushion base portion, each wafer engaging finger having a wafer engagement portion, the engagement of each sequential wafer alternating between the plurality of wafer engagement portions of the first upright cushion base portion and the plurality of wafer engagement portions of the second upright cushion base portion, wherein the wafer engagement portions of the fingers of the first upright cushion base are laterally spaced from the engagement portions of the fingers of the second base portions, the interiorly facing side of the door having a plurality of apertures, the cushion base portions each having at least one shaft extending from each of said base portions, each cushion base portion attached to the door by way of the shaft portions extending through said apertures.

14. A wafer enclosure comprising an enclosure portion and a door, the enclosure portion with a front having a door frame defining a front opening for insertion and removal of wafers, the enclosure portion having a plurality of horizontally oriented slots vertically stacked for receiving a plurality of axially aligned horizontally oriented wafers, the door configured for closing the open front and latching to the door frame, the door having an interiorly facing side and a first upright cushion base portion and a second upright cushion base portion attached to the door at said interiorly facing side, each of the upright cushion base portions having a plurality of parallel wafer engaging fingers extending from said cushion base portion, each wafer engaging finger having a wafer engagement portion, each sequential wafer engagement portion of each wafer engaging finger of each respective cushion base portion engaging alternate ones of the axially aligned horizontally oriented wafers by the respective wafer engagement portions, wherein the wafers engaged by the first upright cushion base portion are different than the wafers engaged by the second upright cushion base portion, wherein each wafer engaging finger of each cushion extends laterally from the base in a first direction and wherein each wafer cushion base portion further comprises at least one integral extension member extending laterally from the base portion in the first direction, and wherein said extension member has an intermediate portion and a door contact portion opposite the base portion whereby when wafers engage said wafer engagement fingers the door contact portion bears against the door thereby precisely controlling the engagement of the wafer engagement fingers with the wafers.

15. The wafer enclosure of claim 14, wherein each cushion has a plurality of integral extension members and wherein said plurality of wafer extension members are positioned intermediate pairs of wafer engagement fingers.

16. A wafer enclosure comprising an enclosure portion and a door, the enclosure portion having a front with a door frame defining a front opening for insertion and removal of wafers, the enclosure portion configured for receiving a plurality of axially aligned horizontally oriented wafers, the door configured for closing the open front, the door having an interiorly facing side and a first upright cushion attached to the door, said first cushion having an elongate base portion attached to the door and a plurality of parallel wafer engaging fingers extending from said base portion in a first direction, each wafer engaging finger having a finger portion and a wafer engaging portion, the wafer engaging portion laterally displaced in a first direction from the base portion, the cushion further having a door contacting member displaced laterally in the first direction from the base portion for providing support to the wafer engagement fingers.

17. The wafer enclosure of claim 16, further comprising another plurality of parallel wafer engaging fingers extending from said base portion in a second lateral direction opposite from the first.

18. A wafer enclosure for holding a plurality of wafers in a horizontal stacked configuration, the enclosure having a wall with an inwardly facing surface, an outwardly facing surface, an attachment opening in said wall, said opening having a diameter, a front opening for passing wafers to and from said enclosure, a door to close said front opening, and an elongate wafer engagement component for contacting the edge portions of wafers stacked in the enclosure, the wafer engagement component comprising a base portion that extends along the inwardly facing surface, an attachment portion integral with said base portion for insertion into said attachment opening, the attachment portion having a shank portion extending through the opening and a flange portion at the end of said shank portion opposite the base portion for engagement with the outwardly facing surface and for retaining the attachment portion in the attachment opening thereby securing the wafer engagement component to the wall, the flange portion configured to allow insertion of the attachment portion into the attachment opening by deflecting laterally the flange portion, and an elastomeric o-ring position on the shank portion for providing sealing between the wafer engagement member and the wall.

19. The wafer enclosure of claim 18, wherein the wafer engagement member is a wafer cushion.

20. A wafer enclosure for carrying wafers, the enclosure comprising a rigid outer shell with an open front and a door attachable to said shell, said door having a rigid wall portion comprised of plastic with an aperture extending therethrough and a wafer cushion configured for attachment to said enclosure at said aperture without the use of separate fasteners, the cushion having a base portion confronting the wall portion with a plurality of prongs extending outwardly therefrom for engaging with the wall portion at the aperture, the cushion comprising PEEK.

21. A wafer enclosure for carrying wafers, the enclosure comprising a rigid outer shell with an open front and a door to close said open front, said door having a rigid wall portion comprised of plastic and including an aperture through said rigid wall portion, and a wafer cushion for attachment to said door at said aperture without the use of separate fasteners, the component having a base portion confronting the wall portion with a plurality of wafer engagement fingers extending outwardly therefrom, the wafer engagement fingers each having an outer wafer engaging surface, the cushion comprising PEEK.

22. A wafer enclosure comprising an enclosure portion and a door, the enclosure portion with a front having a door frame defining a front opening for insertion and removal of wafers, the enclosure portion having a plurality of horizontally oriented slots vertically stacked for receiving a plurality of axially aligned and horizontally oriented wafers, the door configured for closing the open front and latching to the door frame, the door having an interiorly facing side with an aperture extending therethrough, and a cushion attached at the interiorly facing side at said aperture, the cushion comprising a first plurality of vertically aligned wafer engagement portions, and a second plurality of vertically aligned wafer engagement portions horizontally spaced from the first plurality, each sequential wafer being engaged alternately by wafer engagement portions of the first plurality and wafer engagement portions of the second plurality.

23. The wafer enclosure of claim 22 wherein the cushion comprises a first cushion base portion and a second cushion base portion, and wherein the first plurality of wafer engagement portions extend from the first cushion base portion, and the second plurality of wafer engagement portions extends from the second cushion base portion.

24. The wafer enclosure of claim 23 wherein the first cushion base portion is integral with the first engagement portions, and the second cushion base portion is integral with the second engagement portions and the first cushion base portion is not integral with the second cushion base portion.

25. A wafer enclosure for holding a plurality of axially aligned wafers, the enclosure comprising a door with a cushion system thereon, the cushion system comprising a plurality of wafer engagement portions to engage each sequential wafer, each sequential wafer engagement portion circumferentially offset with respect to adjacent wafer engagement portions, the door having a surface with a plurality of apertures extending therethrough, the cushion system having a plurality of prongs extending therefrom for insertion and engagement with the door at said aperture, the cushion system comprised of PEEK.

* * * * *